United States Patent
Pillow et al.

(10) Patent No.: US 10,032,984 B2
(45) Date of Patent: Jul. 24, 2018

(54) POLYMER AND ORGANIC LIGHT EMITTING DEVICE

(71) Applicants: Cambridge Display Technology Limited, Godmanchester (GB); Sumitomo Chemical Company Limited, Tokyo (JP)

(72) Inventors: Jonathan Pillow, Godmanchester (GB); Martin Humphries, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 0 days.

(21) Appl. No.: 15/520,937

(22) PCT Filed: Oct. 20, 2015

(86) PCT No.: PCT/GB2015/053119
§ 371 (c)(1),
(2) Date: Apr. 21, 2017

(87) PCT Pub. No.: WO2016/063031
PCT Pub. Date: Apr. 28, 2016

(65) Prior Publication Data
US 2018/0019400 A1 Jan. 18, 2018

(30) Foreign Application Priority Data
Oct. 23, 2014 (GB) .................. 1418869.2

(51) Int. Cl.
*H01L 35/24* (2006.01)
*H01L 51/00* (2006.01)
(Continued)

(52) U.S. Cl.
CPC .......... *H01L 51/0039* (2013.01); *C08G 61/10* (2013.01); *C09K 11/06* (2013.01);
(Continued)

(58) Field of Classification Search
CPC ...... H01L 51/0039; C08G 61/10; C09K 11/06
(Continued)

(56) References Cited

U.S. PATENT DOCUMENTS 5,317,169 A * 5/1994 Nakano .................. C08G 61/00
257/40
9,559,307 B2 * 1/2017 Steudel ............... H01L 51/0043
(Continued)

FOREIGN PATENT DOCUMENTS

| | | |
|---|---|---|
| JP | 2011-115454 A | 6/2011 |
| JP | 2012-241170 A | 10/2012 |
| KR | 10-2014-0118239 A | 8/2014 |
| WO | WO 2013/156125 A1 | 10/2013 |
| WO | WO 2015/015183 A1 | 2/2015 |

OTHER PUBLICATIONS

GB1418869.2, Aug. 21, 2015, Combined Search and Examination Report.
(Continued)

*Primary Examiner* — David S Blum
(74) *Attorney, Agent, or Firm* — Wolf, Greenfield & Sacks, P.C.

(57) ABSTRACT

A polymer comprising a repeat unit of formula (I): wherein $R^1$ in each occurrence is independently H or a substituent; $R^2$ in each occurrence is independently a substituent; and x is 0, 1, 2 or 3. The polymer may be used as a light-emitting polymer in an organic light-emitting device.

13 Claims, 3 Drawing Sheets

(51) Int. Cl.
  *C09K 11/06* (2006.01)
  *C08G 61/10* (2006.01)
  *H01L 51/56* (2006.01)
  *H01L 51/52* (2006.01)
  *H01L 51/50* (2006.01)

(52) U.S. Cl.
  CPC ............... *C08G 2261/122* (2013.01); *C08G 2261/1412* (2013.01); *C08G 2261/314* (2013.01); *C08G 2261/3142* (2013.01); *C08G 2261/411* (2013.01); *C08G 2261/5222* (2013.01); *C08G 2261/64* (2013.01); *C08G 2261/95* (2013.01); *C09K 2211/1416* (2013.01); *H01L 51/0003* (2013.01); *H01L 51/5016* (2013.01); *H01L 51/5056* (2013.01); *H01L 51/5088* (2013.01); *H01L 51/5206* (2013.01); *H01L 51/5221* (2013.01); *H01L 51/56* (2013.01)

(58) Field of Classification Search
  USPC .......................................................... 257/40
  See application file for complete search history.

(56) References Cited

U.S. PATENT DOCUMENTS

2007/0152209 A1    7/2007   Uckert
2013/0135570 A1    5/2013   Mizusaki et al.

OTHER PUBLICATIONS

PCT/GB2015/053119, Dec. 22, 2015, International Search Report and Written Opinion.
Combined Search and Examination Report dated Aug. 21, 2015 for Application No. GB1418869.2.
International Search Report and Written Opinion dated Dec. 22, 2015 for Application No. PCT/GB2015/053119.
Kushwaha et al., Synthesis and physical characterization of electrically conducting polymers of polynuclear aromatic sulfonyl compounds. J Saudi Chem Soc. Oct. 1, 2009;13(3):303-9.
CAPLUS Submission; Accession No. 2012:1793997. Usui, Dec. 10, 2012. 3 pages.
CAPLUS Submission; Accession No. 2014:1734886. Choi et al., Oct. 14, 2014. 9 pages.

* cited by examiner

POLYMER AND ORGANIC LIGHT EMITTING DEVICE

RELATED APPLICATIONS

This application is a national stage filing under 35 U.S.C. § 371 of international PCT application, PCT/GB2015/053119, filed Oct. 20, 2015, which claims priority to United Kingdom patent application, GB 1418869.2, filed Oct. 23, 2014, each of which is incorporated herein by reference in its entirety.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, a light-emitting dopant in which light is emitted via decay of a triplet exciton).

Bernius et al, "Progress with Light-Emitting Polymers", Adv. Mater. 2000, 12(23), 1737-1750 discloses conjugated polymers for use in organic light-emitting devices including polyphenylenes, polyfluorenes and polyphenylenevinylenes.

EP 1741149 discloses polymers comprising 2,7-linked phenanthrene repeat units.

US 2010/288974 discloses polymers comprising 3,6-linked phenanthrene repeat units.

US 2007/0191583 discloses polymers based on 3,6- and 2,7-linked phenanthrenes.

SUMMARY OF THE INVENTION

In a first aspect the invention provides a polymer comprising a repeat unit of formula (I):

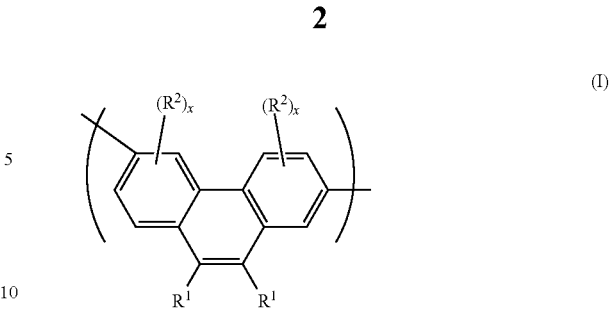

wherein $R^1$ in each occurrence is independently H or a substituent; $R^2$ in each occurrence is independently a substituent; and each x independently 0, 1, 2 or 3.

In a second aspect the invention provides an organic light-emitting device comprising an anode, a cathode and a semiconducting region between the anode and the cathode wherein the semiconducting region comprises a polymer according to the first aspect.

In a third aspect the invention provides a formulation comprising a polymer according to the first aspect and at least one solvent.

In a fourth aspect the invention provides a method of forming a device according to the third aspect, the method comprising the steps of depositing a formulation according to the third aspect and evaporating the at least one solvent.

In a fifth aspect the invention provides use of a repeat unit polymer of formula (I) to enhance the solubility of a polymer:

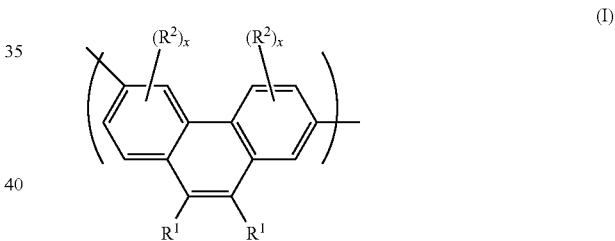

wherein $R^1$ in each occurrence is independently H or a substituent; $R^2$ in each occurrence is independently a substituent; and x is 0, 1, 2 or 3.

DESCRIPTION OF THE DRAWINGS

The invention will now be described in more detail with reference to the drawings in which.

DETAILED DESCRIPTION OF THE INVENTION

Figure 1:
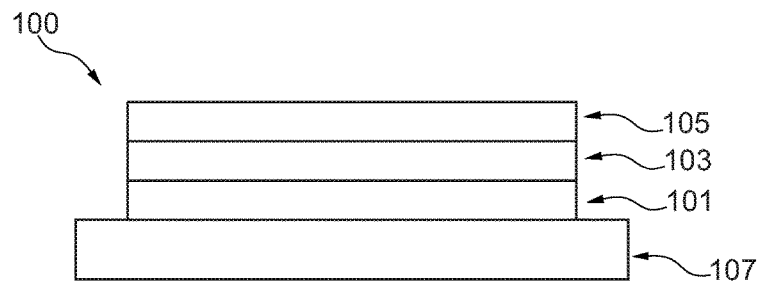
FIG. 1 illustrates schematically an OLED according to an embodiment of the invention.

FIG. 1, which is not drawn to any scale, illustrates an OLED 100 according to an embodiment of the invention comprising an anode 101, a cathode 105 and a light-emitting layer 103 between the anode and cathode. The device 100 is supported on a substrate 107, for example a glass or plastic substrate.

Light-emitting layer 103 may be unpatterned, or may be patterned to form discrete pixels. Each pixel may be further divided into subpixels. The light-emitting layer may contain a single light-emitting material, for example for a monochrome display or other monochrome device, or may contain materials emitting different colours, in particular red, green and blue light-emitting materials for a full-colour display.

Light-emitting layer 103 contains a polymer comprising repeat units of formula (I). The light-emitting layer 103 may consist essentially of the polymer or may contain one or more further materials, for example one or more charge-transporting materials or one or more light-emitting materials. The polymer may be a light-emitting polymer. The polymer may be a host polymer used in combination with one or more light-emitting dopants selected from fluorescent and phosphorescent dopants. If the polymer is used as a host then it preferably has a lowest excited stated energy level that is at least the same as or higher than the corresponding lowest excited state energy level of the light-emitting dopant from which radiative exciton decay occurs. In the case of a fluorescent dopant this lowest excited state is the lowest singlet excited state ($S_1$). In the case of a phosphorescent dopant this lowest excited state is the lowest triplet excited state ($T_1$).

Singlet energy levels as described anywhere herein may be as measured from a material's fluorescence spectrum. Triplet energy levels as described anywhere herein may be as measured from the energy onset (energy at half of the peak intensity on the high energy side) of the phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718).

One or more further layers may be provided between the anode 101 and cathode 105.

Further layers may be selected from one or more further light emitting layers, hole-injection layers, hole-transporting layers, electron transporting layers, hole blocking layers and electron blocking layers.

Preferred device structures include:
Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

Preferably, at least one of a hole-transporting layer and hole injection layer is present. Preferably, both a hole injection layer and hole-transporting layer are present.

In an embodiment, substantially all light emitted from the device may be light emitted from the polymer comprising a repeat unit of formula (I).

In an embodiment, substantially all light is emitted from materials other than the polymer comprising a repeat unit of formula (I).

The OLED may be a white-emitting OLED. A white-emitting OLED may contain a single, white-emitting layer or may contain two or more layers that emit different colours which, in combination, produce white light. White light may be produced from a combination of red, green and blue light-emitting materials provided in a single light-emitting layer or distributed within two or more light-emitting layers. In a preferred arrangement, the device has a light-emitting layer comprising a red light-emitting material and a light-emitting layer comprising green and blue light-emitting materials.

The light emitted from a white-emitting OLED may have CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-4500K, optionally greater than 3500K.

A blue emitting material may have a photoluminescent spectrum with a peak in the range of 420-490 nm, more preferably 420-480 nm.

A green emitting material may have a photoluminescent spectrum with a peak in the range of more than 490 nm up to 580 nm, optionally more than 490 nm up to 540 nm.

A red emitting material may optionally have a peak in its photoluminescent spectrum of more than 580 nm up to 630 nm, optionally 585-625 nm.

In the embodiment of FIG. 1, the polymer comprising a repeat unit of formula (I) is provided in a light-emitting layer of the device.

In other embodiments (not shown), the polymer comprising a repeat unit of formula (I) may be provided in a charge-transporting layer, for example a hole-transporting layer or electron-transporting layer, in which case the light-emitting layer may or may not contain a polymer comprising a repeat unit of formula (I).

The polymer may contain only one repeating unit of formula (I), or may contain two or more different repeating units of formula (I).

Preferably, the 2- and 6-carbon atoms of repeat unit of formula (I) are bound directly to an aromatic carbon atom of an adjacent repeat unit.

The extent of conjugation across the 2,6-linked phenanthrene repeat unit of formula (I) is limited as compared to a 2,7-linked phenanthrene repeat unit. A 2,7-linked phenanthrene repeat unit in a conjugated polymer backbone can conjugate to adjacent aromatic or heteroaromatic repeat units to provide a conjugation path across the repeat unit, as illustrated in Scheme 1 showing a resonance structure of a 2,7-linked phenanthrene adjacent to two phenyl groups.

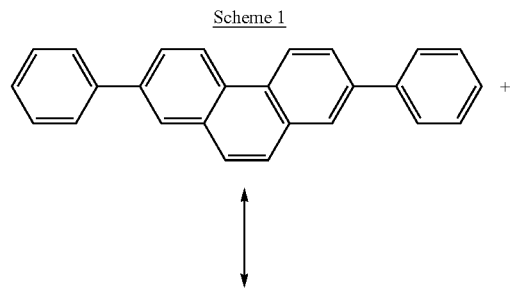

Scheme 1

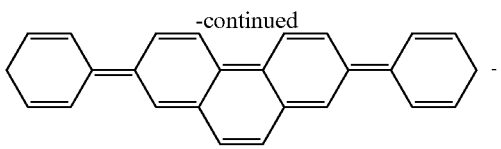

In contrast, as shown in Scheme 2 a resonance structure in which the 2,7-linked phenanthrene of Scheme 1 is replaced with a 2,6-linked phenanthrene cannot be drawn.

Scheme 2

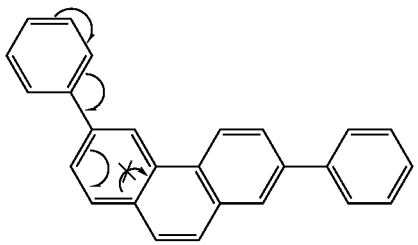

Accordingly, although a repeat unit of formula (I) may provide a conjugation path between repeat units adjacent to the unit of formula (I), the extent of conjugation is limited as compared to that provided by a 2,7-linked phenanthrene repeat unit. The singlet and/or triplet excited state of a polymer may be increased by limiting the extent of conjugation along the polymer backbone in this way. The HOMO and/or LUMO levels of polymers comprising repeat units of formula (I) may be substantially the same as those of polymers linked through other positions.

The repeat unit of formula (I) creates an angle of about 120° along the polymer backbone. The inventors have surprisingly found repeat units of formula (I) increase the solubility of the polymer as compared to a polymer containing 2,7-linked phenanthrene repeat units.

$R^1$ and $R^2$ of formula (I) may each independently be selected from the group consisting of:
  alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
  aryl and heteroaryl groups that may be unsubstituted or substituted with one or more substituents, preferably phenyl substituted with one or more $C_{1-20}$ alkyl groups;
  a linear or branched chain of aryl or heteroaryl groups, each of which groups may independently be substituted, for example a group of formula —$(Ar^7)_r$ wherein each $Ar^7$ is independently an aryl or heteroaryl group and r is at least 2, preferably a branched or linear chain of phenyl groups each of which may be unsubstituted or substituted with one or more $C_{1-20}$ alkyl groups; and
  a crosslinkable-group, for example a group comprising a double bond such and a vinyl or acrylate group, or a benzocyclobutane group.

In the case where $R^1$ or $R^2$ comprises an aryl or heteroaryl group, or a linear or branched chain of aryl or heteroaryl groups, the or each aryl or heteroaryl group may be substituted with one or more substituents $R^3$ selected from the group consisting of:
  alkyl, for example $C_{1-20}$ alkyl, wherein one or more non-adjacent C atoms may be replaced with O, S, substituted N, C=O and —COO— and one or more H atoms of the alkyl group may be replaced with F;
  $NR^9_2$, $OR^9$, $SR^9$, $SiR^9_3$ and
  fluorine, nitro and cyano;
wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^6$— wherein $R^6$ is a substituent and is optionally in each occurrence a $C_{1-40}$ hydrocarbyl group, optionally a $C_{1-20}$ alkyl group.

A crosslinkable group $R^1$ or $R^2$ may contain a crosslinking group bound directly to the phenanthrene of formula (I), or may be spaced apart therefrom by a spacer group. The spacer group may be selected from $C_{1-20}$ alkyl or aryl-$C_{1-20}$ alkyl, optionally phenyl-$C_{1-20}$ alkyl, wherein one or more non-adjacent C atoms of the alkyl may be replaced with O, $SiR^4_2$, C=O or COO wherein $R^4$ is $C_{1-20}$ hydrocarbyl, optionally $C_{1-20}$ alkyl.

Preferably, each $R^1$ and, where present, each $R^2$ is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

Preferably, each x is 0.

A polymer comprising repeat units of formula (I) may be a homopolymer, or a copolymer comprising repeat units of formula (I) and one or more co-repeat units.

Repeat units of formula (I) may make up 1-99 mol % of the repeat units of a copolymer, optionally 1-50 mol %, optionally 1-20 mol %.

Exemplary co-repeat units include charge-transporting repeat units and light-emitting repeat units.

One preferred class of arylene repeat units is phenylene repeat units, such as phenylene repeat units of formula (VI):

wherein w in each occurrence is independently 0, 1, 2, 3 or 4, optionally 1 or 2; n is 1, 2 or 3; and $R^7$ independently in each occurrence is a substituent.

Where present, each $R^7$ may independently be selected from the group consisting of:
  alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
  aryl and heteroaryl groups that may be unsubstituted or substituted with one or more substituents, preferably phenyl substituted with one or more $C_{1-20}$ alkyl groups;
  a linear or branched chain of aryl or heteroaryl groups, each of which groups may independently be substituted, for example a group of formula —$(Ar^7)_r$ wherein each $Ar^7$ is independently an aryl or heteroaryl group and r is at least 2, preferably a branched or linear chain of phenyl groups each of which may be unsubstituted or substituted with one or more $C_{1-20}$ alkyl groups; and a crosslinkable-group, for example a group comprising a double bond such and a vinyl or acrylate group, or a benzocyclobutane group.

In the case where $R^7$ comprises an aryl or heteroaryl group, or a linear or branched chain of aryl or heteroaryl groups, the or each aryl or heteroaryl group may be substituted with one or more substituents $R^8$ selected from the group consisting of:

alkyl, for example $C_{1-20}$ alkyl, wherein one or more non-adjacent C atoms may be replaced with O, S, substituted N, C=O and —COO— and one or more H atoms of the alkyl group may be replaced with F;

$NR^9{}_2$, $OR^9$, $SR^9$, $SiR^9{}_3$ and fluorine, nitro and cyano;

wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^6$— wherein $R^6$ is as described above.

Preferably, each $R^7$, where present, is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

If n is 1 then exemplary repeat units of formula (VI) include the following:

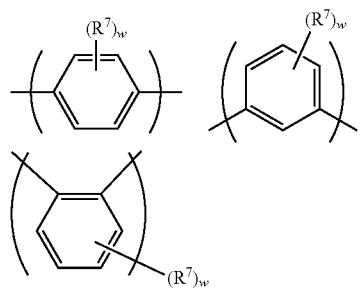

A particularly preferred repeat unit of formula (VI) has formula (VIa):

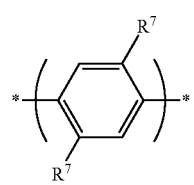

(VIa)

Substituents $R^7$ of formula (VIa) are adjacent to linking positions of the repeat unit, which may cause steric hindrance between the repeat unit of formula (VIa) and adjacent repeat units, resulting in the repeat unit of formula (VIa) twisting out of plane relative to one or both adjacent repeat units.

Exemplary repeat units where n is 2 or 3 include the following:

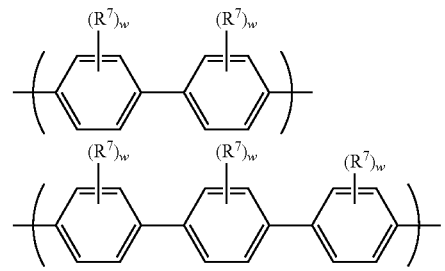

A preferred repeat unit has formula (VIb):

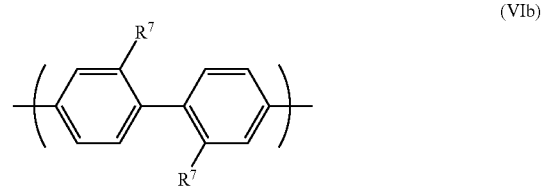

(VIb)

The two $R^7$ groups of formula (VIb) may cause steric hindrance between the phenyl rings they are bound to, resulting in twisting of the two phenyl rings relative to one another.

A further class of arylene repeat units is optionally substituted fluorene repeat units, such as repeat units of formula (VII):

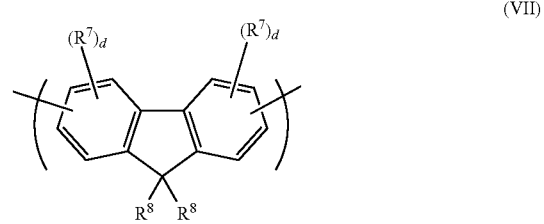

(VII)

wherein $R^8$ in each occurrence is the same or different and is a substituent wherein the two groups $R^8$ may be linked to form a ring; $R^7$ is a substituent as described above; and d is 0, 1, 2 or 3.

Each $R^8$ may independently be selected from the group consisting of:

alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;

aryl and heteroaryl groups that may be unsubstituted or substituted with one or more substituents, preferably phenyl substituted with one or more $C_{1-20}$ alkyl groups;

a linear or branched chain of aryl or heteroaryl groups, each of which groups may independently be substituted, for example a group of formula —$(Ar^7)_r$ wherein each $Ar^7$ is independently an aryl or heteroaryl group and r is at least 2, optionally 2 or 3, preferably a branched or linear chain of phenyl groups each of which may be unsubstituted or substituted with one or more $C_{1-20}$ alkyl groups; and a crosslinkable-group, for example a group comprising a double bond such and a vinyl or acrylate group, or a benzocyclobutane group.

Preferably, each $R^8$ is independently a $C_{1-40}$ hydrocarbyl group.

Substituted N, where present, may be —$NR^6$— wherein $R^6$ is as described above.

The aromatic carbon atoms of the fluorene repeat unit may be unsubstituted, or may be substituted with one or more substituents $R^7$ as described with reference to Formula (VI).

Exemplary substituents $R^7$ are alkyl, for example $C_{1-20}$ alkyl, wherein one or more non-adjacent C atoms may be replaced with O, S, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

The repeat unit of formula (VII) may have two different substituents $R^8$, for example as described in WO 2012/104579, the contents of which are incorporated herein by reference.

The extent of conjugation of repeat units of formula (VII) to aryl or heteroaryl groups of adjacent repeat units in the polymer backbone may be controlled by (a) linking the repeat unit through the 3- and/or 6-positions to limit the extent of conjugation across the repeat unit, and/or (b) substituting the repeat unit with one or more substituents $R^7$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

The repeat unit of formula (VII) may be a 2,7-linked repeat unit of formula (VIIa):

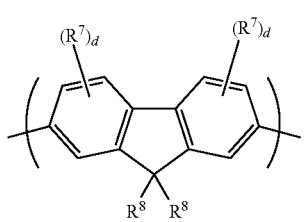
(VIIa)

A relatively high degree of conjugation across the repeat unit of formula (VIIa) may be provided in the case where each d=0, or where any substituent $R^7$ is not present at a position adjacent to the linking 2- or 7-positions of formula (VIIa).

A relatively low degree of conjugation across the repeat unit of formula (VIIa) may be provided in the case where at least one d is at least 1, and where at least one substituent $R^7$ is present at a position adjacent to the linking 2- or 7-positions of formula (VIIa). Optionally, each d is 1 and the 3- and/or 6-position of the repeat unit of formula (VIIa) is substituted with a substituent $R^7$ to provide a relatively low degree of conjugation across the repeat unit.

The repeat unit of formula (VII) may be a 3,6-linked repeat unit of formula (VIIb)

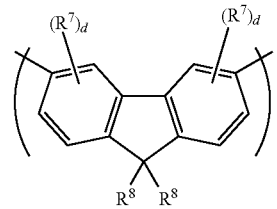
(VIIb)

The extent of conjugation across a repeat unit of formula (VIIb) may be relatively low as compared to a corresponding repeat unit of formula (VIIa).

Another exemplary arylene repeat unit has formula (VIII):

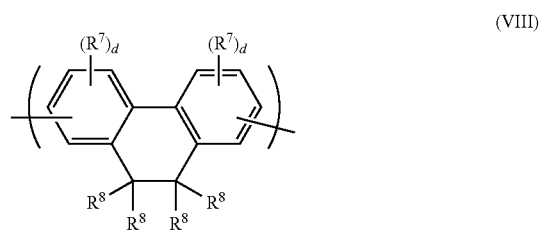
(VIII)

wherein $R^7$, $R^8$ and d are as described with reference to formulae (VI) and (VII) above. Any of the $R^7$ groups may be linked to any other of the $R^7$ groups to form a ring. The ring so formed may be unsubstituted or may be substituted with one or more substituents, optionally one or more $C_{1-20}$ alkyl groups.

Repeat units of formula (VIII) may have formula (VIIIa) or (VIIIb):

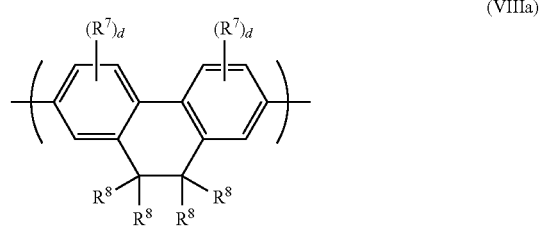
(VIIIa)

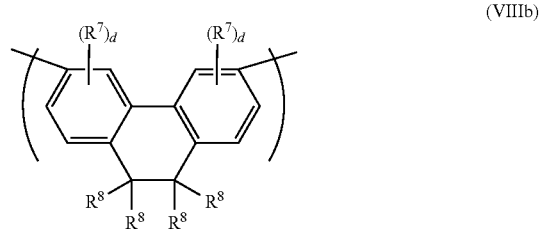
(VIIIb)

The one or more co-repeat units may include a conjugation-breaking repeat unit, which is a repeat unit that does not provide any conjugation path between repeat units adjacent to the conjugation-breaking repeat unit.

Exemplary conjugation-breaking co-repeat units include co-repeat units of formula (II):

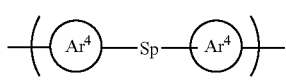

(II)

wherein:

Ar⁴ in each occurrence independently represents an aryl or heteroaryl group that may be unsubstituted or substituted with one or more substituents; and Sp represents a spacer group comprising at least one carbon or silicon atom.

Preferably, the spacer group Sp includes at least one $sp^3$-hybridised carbon atom separating the $Ar^4$ groups.

Preferably $Ar^4$ is an aryl group and the $Ar^4$ groups may be the same or different. More preferably each $Ar^4$ is phenyl.

Each $Ar^4$ may independently be unsubstituted or may be substituted with 1, 2, 3 or 4 substituents. The one or more substituents may be selected from:

- $C_{1-20}$ alkyl wherein one or more non-adjacent C atoms of the alkyl group may be replaced by O, S or COO, C=O, $NR^6$ or $SiR^6{}_2$ and one or more H atoms of the $C_{1-20}$ alkyl group may be replaced by F wherein $R^6$ is a substituent and is optionally in each occurrence a $C_{1-40}$ hydrocarbyl group, optionally a $C_{1-20}$ alkyl group; and
- aryl or heteroaryl, optionally phenyl, that may be unsubstituted or substituted with one or more $C_{1-20}$ alkyl groups.

Preferred substituents of $Ar^4$ are $C_{1-20}$ alkyl groups, which may be the same or different in each occurrence.

Exemplary groups Sp include a $C_{1-20}$ alkyl chain wherein one or more non-adjacent C atoms of the chain may be replaced with O, S, —$NR^6$—, —$SiR^6{}_2$—, —C(=O)— or —COO— and wherein $R^6$ in each occurrence is a substituent and is optionally in each occurrence a $C_{1-40}$ hydrocarbyl group, optionally a $C_{1-20}$ alkyl group.

Exemplary repeat units of formula (II) include the following, wherein R in each occurrence is H or $C_{1-5}$ alkyl:

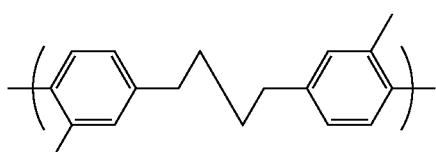

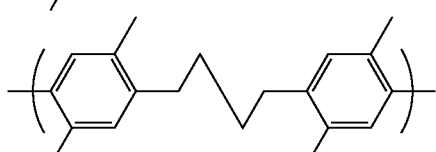

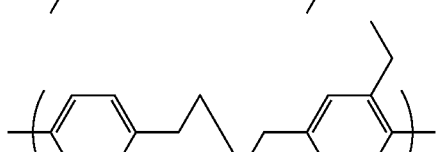

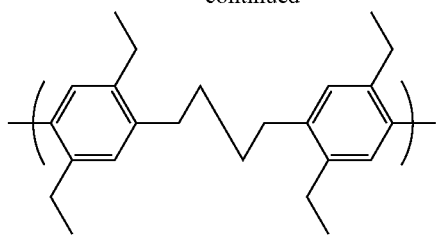

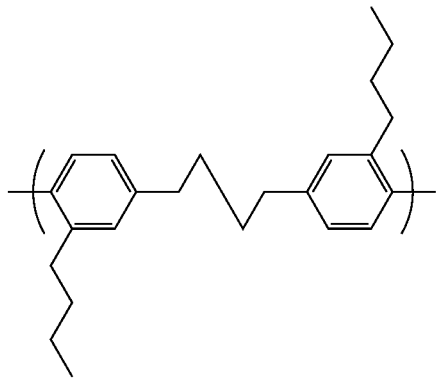

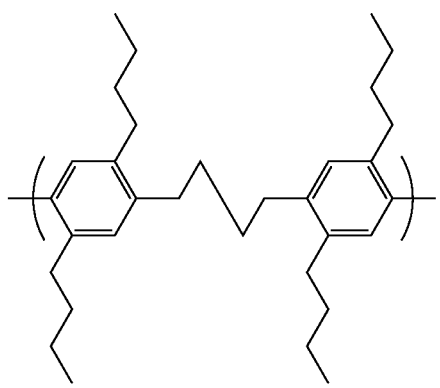

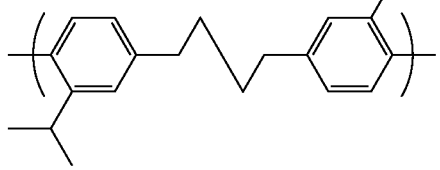

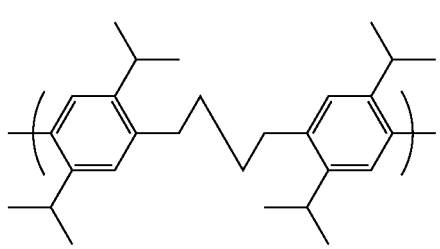

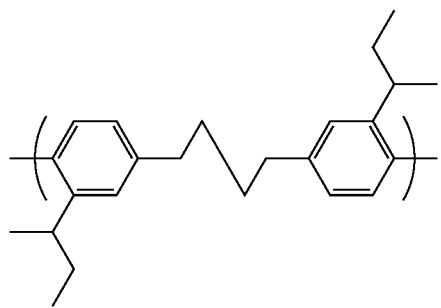
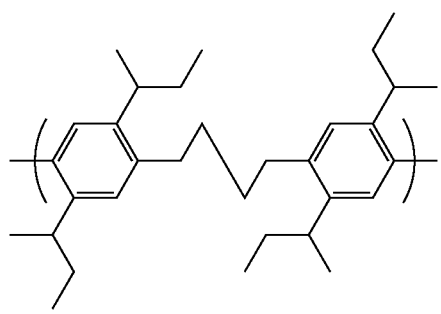
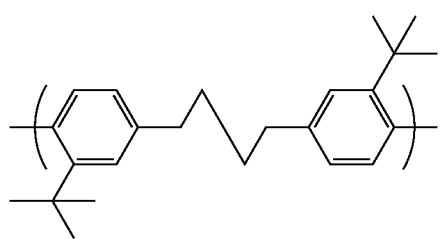
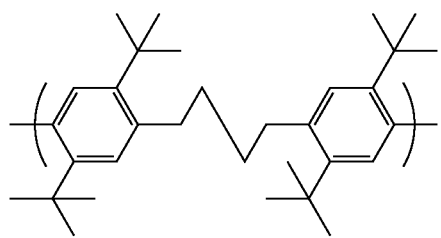
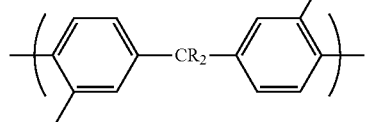
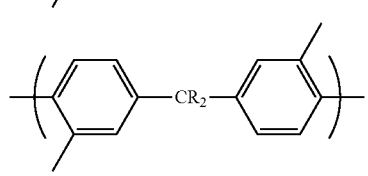
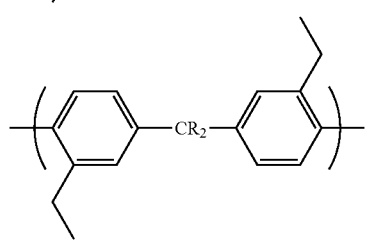
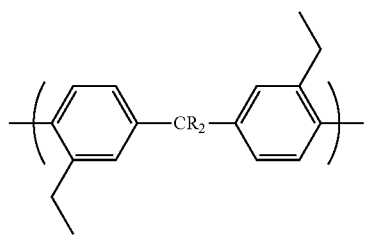
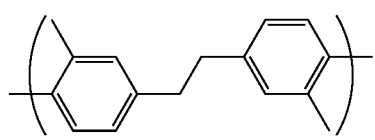
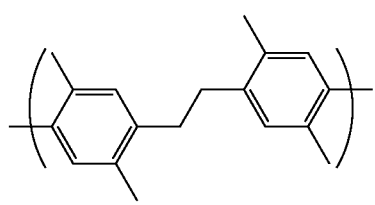
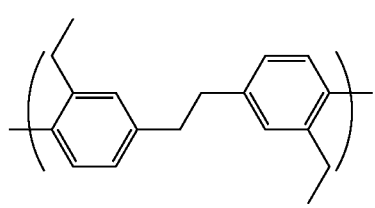
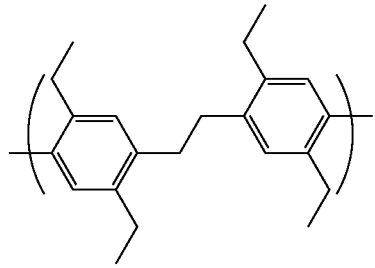
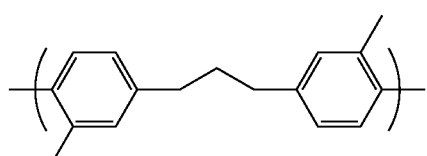
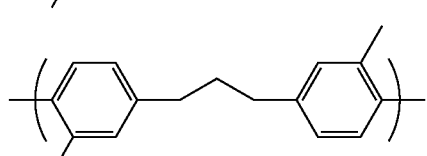
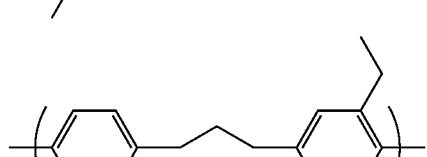

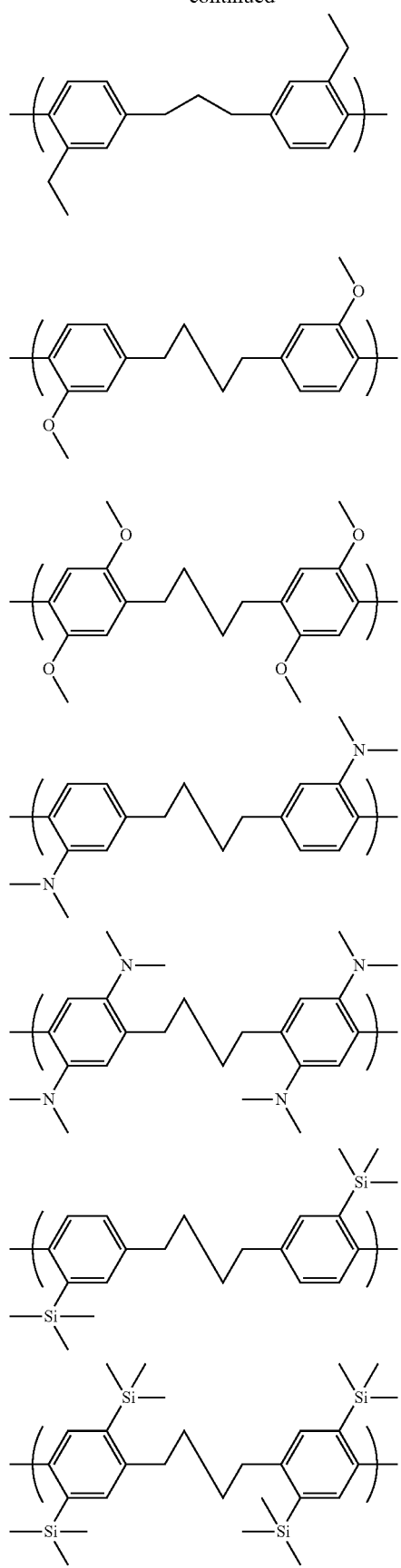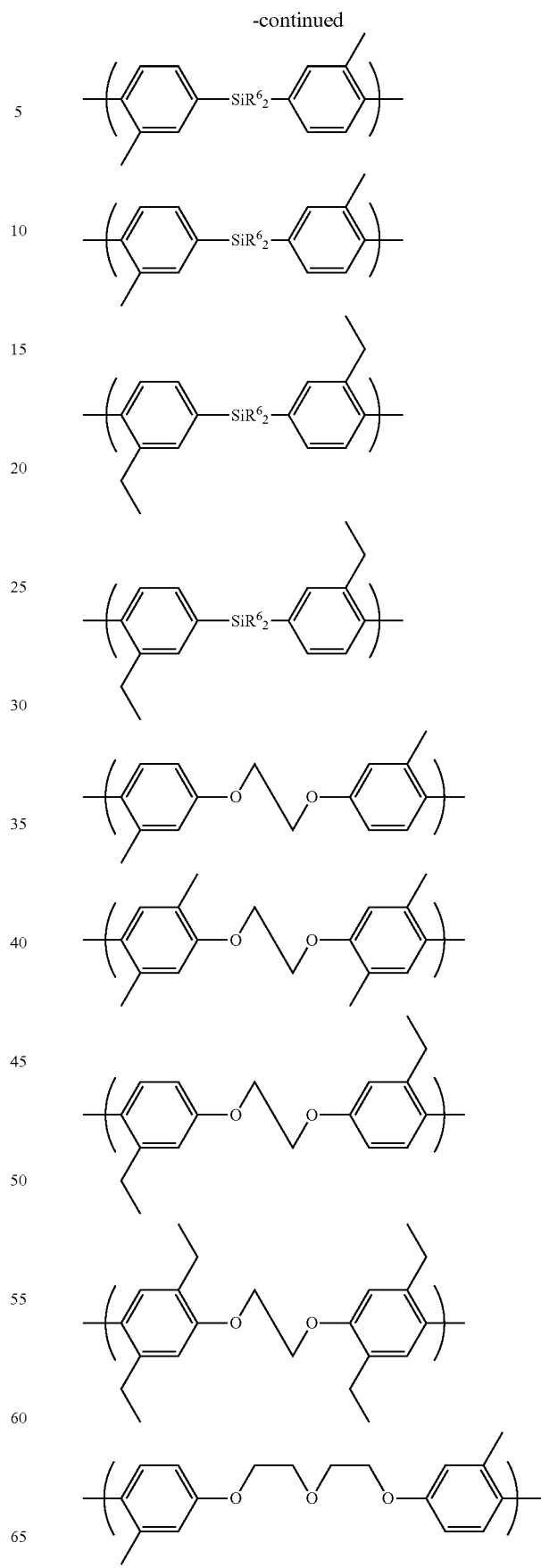

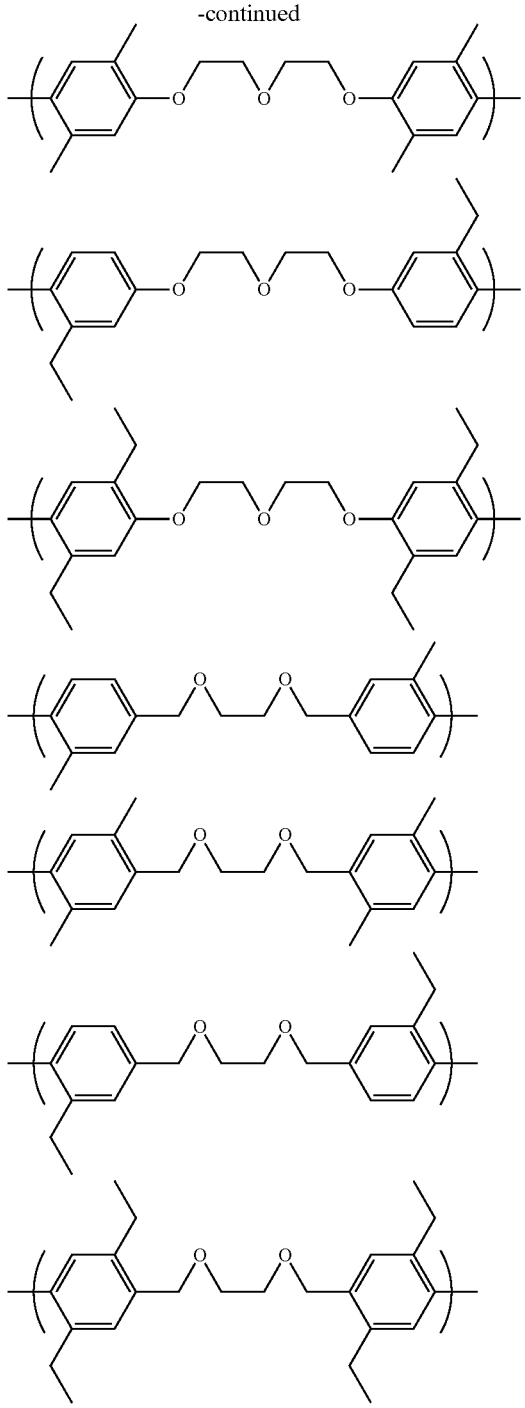

The polymer comprising repeat units of formula (I) may comprise repeat units of formula (III):

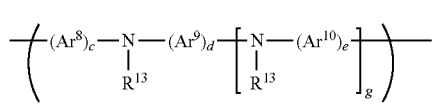
(III)

wherein $Ar^8$, $Ar^9$ and $Ar^{10}$ in each occurrence are independently selected from substituted or unsubstituted aryl or heteroaryl, g is 0, 1 or 2, preferably 0 or 1, $R^{13}$ independently in each occurrence is H or a substituent, preferably a substituent, and c, d and e are each independently 1, 2 or 3.

Repeat units of formula (III) may provide the polymer with hole-transporting properties for use in a hole-transporting layer or light-emitting layer, and/or light-emitting properties for use in a light-emitting layer $R^{13}$, which may be the same or different in each occurrence when g is 1 or 2, is preferably selected from the group consisting of alkyl, for example $C_{1-20}$ alkyl, $Ar^{11}$, a branched or linear chain of $Ar^{11}$ groups, or a crosslinkable unit that is bound directly to the N atom of formula (III) or spaced apart therefrom by a spacer group, wherein $Ar^{11}$ in each occurrence is independently optionally substituted aryl or heteroaryl. Exemplary spacer groups are $C_{1-20}$ alkyl, phenyl and phenyl-$C_{1-20}$ alkyl.

Any two aromatic or heteroaromatic groups selected from $Ar^8$, $Ar^9$, and, if present, $Ar^{10}$ and $Ar^{11}$ directly bound to the same N atom may be linked by a direct bond or a divalent linking atom or group to another of $Ar^8$, $Ar^9$, $Ar^{10}$ and $Ar^{11}$. Preferred divalent linking atoms and groups include O, S; substituted N; and substituted C.

$Ar^8$ is preferably $C_{6-20}$ aryl, more preferably phenyl, that may be unsubstituted or substituted with one or more substituents.

In the case where g=0, $Ar^9$ is preferably $C_{6-20}$ aryl, more preferably phenyl, that may be unsubstituted or substituted with one or more substituents.

In the case where g=1, $Ar^9$ is preferably $C_{6-20}$ aryl, more preferably phenyl or a polycyclic aromatic group, for example naphthalene, perylene, anthracene or fluorene, that may be unsubstituted or substituted with one or more substituents.

$R^{13}$ is preferably $Ar^{11}$ or a branched or linear chain of $Ar^{11}$ groups. $Ar^{11}$ in each occurrence is preferably phenyl that may be unsubstituted or substituted with one or more substituents.

Exemplary groups $R^{13}$ include the following, each of which may be unsubstituted or substituted with one or more substituents, and wherein * represents a point of attachment to N:

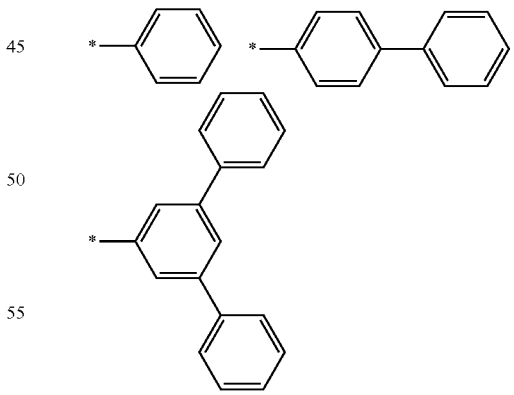

c, d and e are preferably each 1.

$Ar^8$, $Ar^9$, and, if present, $Ar^{10}$ and $Ar^{11}$ are each independently unsubstituted or substituted with one or more, optionally 1, 2, 3 or 4, substituents. Exemplary substituents may be selected from:

substituted or unsubstituted alkyl, optionally $C_{1-20}$ alkyl, wherein one or more non-adjacent C atoms may be replaced with optionally substituted aryl or heteroaryl (preferably phenyl), O, S, C=O or —COO— and one or more H atoms may be replaced with F; and a crosslinkable group attached directly to or forming part of $Ar^8$, $Ar^9$, $Ar^{10}$ or $Ar^{11}$ or spaced apart therefrom by a spacer group, for example a group comprising a double bond such and a vinyl or acrylate group, or a benzocyclobutane group.

Preferred substituents of $Ar^8$, $Ar^9$, and, if present, $Ar^{10}$ and $Ar^{11}$ are $C_{1-40}$ hydrocarbyl, preferably $C_{1-20}$ alkyl or a hydrocarbyl crosslinking group.

Preferred repeat units of formula (III) include units of formulae 1-3:

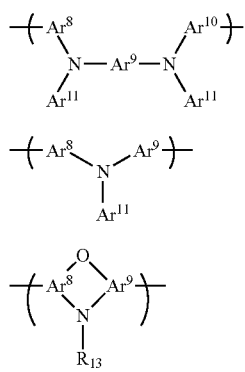

Preferably, $Ar^8$, $Ar^{10}$ and $Ar^{11}$ of repeat units of formula 1 are phenyl and $Ar^9$ is phenyl or a polycyclic aromatic group.

Preferably, $Ar^8$, $Ar^9$ and $Ar^{11}$ of repeat units of formulae 2 and 3 are phenyl.

Preferably, $Ar^8$ and $Ar^9$ of repeat units of formula 3 are phenyl and $R^{13}$ is phenyl or a branched or linear chain of phenyl groups.

A hole-transporting polymer comprising repeat units of formula (III) may be a homopolymer or a copolymer containing repeat units of formula (III) and one or more co-repeat units.

Repeat units of formula (III) may be provided in a molar amount in the range of about 10 mol % up to about 95 mol %, optionally about 10-75 mol % or about 10-50 mol %.

The polymer may contain one or two or more different repeat units of formula (III).

Polymers comprising a repeat unit of formula (I) may be formed by polymerisation of a suitable monomer, either alone to form a homopolymer or, more preferably, with one or more co-monomers to form a copolymer as described herein. A monomer for forming a repeat unit of formula (Im) may have formula (Im):

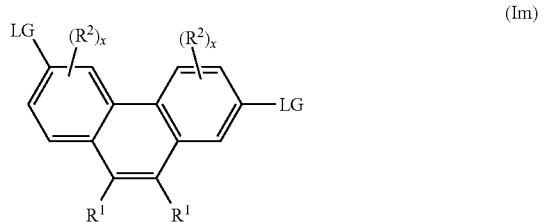

wherein $R^1$, $R^2$ and x are as described above and LG is a leaving group, preferably a group selected from boronic acid or an ester thereof; halogen, optionally bromine or iodine; and sulfonic acid or an ester thereof.

Esters of boronic acids include groups of formula:

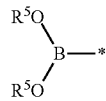

wherein each $R^5$ is independently a $C_{1-10}$ alkyl group and two groups R5 may be linked to form a ring that may be unsubstituted or substituted with one or more $C_{1-5}$ alkyl groups, and * represents a point of attachment to the phenanthrene of formula (Im).

Co-repeat units as described anywhere herein may be formed by polymerisation of corresponding co-monomers substituted with leaving groups LG which may be as described with reference to formula (Im).

The monomer of formula (Im), and any co-monomers, may be polymerized in the presence of a metal catalyst, preferably a palladium compound catalyst or a nickel compound catalyst. Reactions between monomers carrying leaving groups LG can be used to form direct carbon-carbon bonds between aromatic carbon atoms of repeat units of the polymer.

Polymers as described herein suitably have a polystyrene-equivalent number-average molecular weight (Mn) measured by gel permeation chromatography in the range of about $1\times10^3$ to $1\times10^8$, and preferably $1\times10^3$ to $5\times10^6$. The polystyrene-equivalent weight-average molecular weight (Mw) of the polymers described herein may be $1\times10^3$ to $1\times10^8$, and preferably $1\times10^4$ to $1\times10^7$.

The polymers as described anywhere herein are suitably amorphous polymers.

Light-Emitting Materials

The polymer of formula (I) may, in use in an OLED, emit light in which case the polymer of formula (I) may be the only light-emitting material of the OLED or may be provided with one or more further light-emitting materials in the same layer as the polymer of formula (I) or in a separate light-emitting layer.

The polymer of formula (I) may, in use, be non-emissive and may be a hole-transporting or electron-transporting material in a hole-transporting layer or an electron-transporting layer respectively, or may be present in a light-emitting layer of the device, for example as a host material used in combination with one or more fluorescent or phosphorescent light-emitting materials.

Light-emitting materials may be polymeric or non-polymeric and may be selected from fluorescent and phosphorescent light-emitting materials. Preferred phosphorescent light-emitting materials are transition metal complexes.

Exemplary phosphorescent materials are transition metal complexes have formula (IX):

wherein M is a metal; each of $L^1$, $L^2$ and $L^3$ is a coordinating group; q is a positive integer; r and s are each independently 0 or a positive integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$. Preferably, a, b and c are each 1 or 2, more preferably 2 (bidentate ligand). In preferred embodiments, q is 2, r is 0 or 1 and s is 0, or q is 3 and r and s are each 0.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (X):

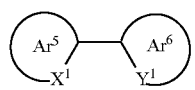

(X)

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and $Ar^6$ is a single ring or fused aromatic, for example phenyl or naphthyl.

To achieve red emission, $Ar^5$ may be selected from phenyl, fluorene, naphthyl and $Ar^6$ are selected from quinoline, isoquinoline, thiophene and benzothiophene.

To achieve green emission, $Ar^5$ may be selected from phenyl or fluorene and $Ar^6$ may be pyridine.

To achieve blue emission, $Ar^5$ may be selected from phenyl and $Ar^6$ may be selected from imidazole, pyrazole, triazole and tetrazole.

Examples of bidentate ligands are illustrated below:

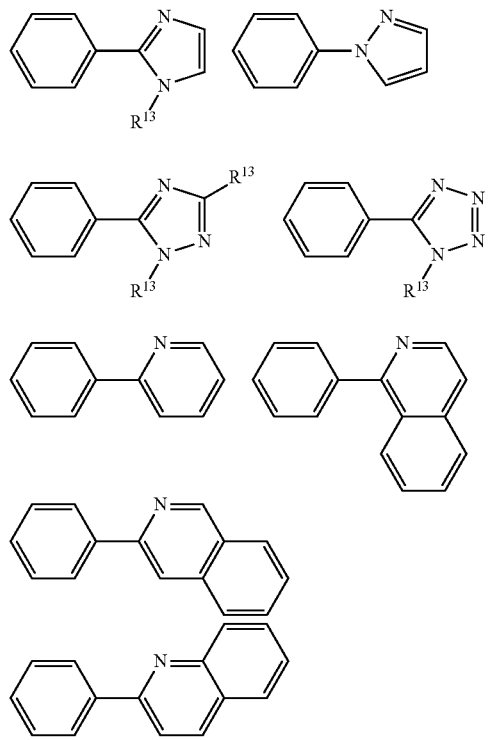

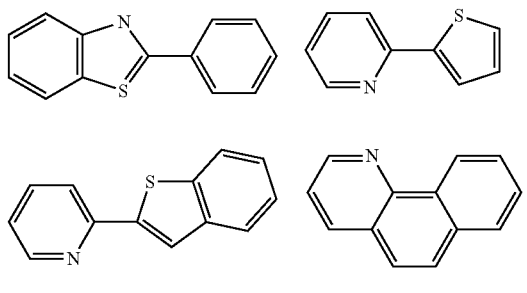

Each of $Ar^5$ and $Ar^6$ may carry one or more substituents. Two or more of these substituents may be linked to form a ring, for example an aromatic ring.

Other ligands suitable for use with d-block elements include diketonates, in particular acetylacetonate (acac), tetrakis-(pyrazol-1-yl)borate, 2-carboxypyridyl, triarylphosphines and pyridine, each of which may be substituted.

Exemplary substituents include groups $R^7$ as described above with reference to Formula (VI). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; charge transporting groups, for example carbazole which may be used to assist hole transport to the complex when used as an emissive material, for example as disclosed in WO 02/81448; and dendrons which may be used to obtain or enhance solution processability of the metal complex, for example as disclosed in WO 02/66552. If substituents $R^7$ include a charge-transporting group then the compound of formula (IX) may be used in light-emitting layer 107 without a separate host material.

A light-emitting dendrimer comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XI)

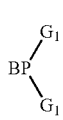

(XI)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIa):

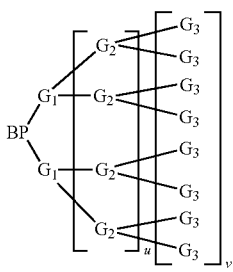

(XIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each or BP and $G_1$, $G_2$ ... $G_n$ is phenyl, and each phenyl BP, $G_1$, $G_2$ ... $G_{n-1}$ is a 3,5-linked phenyl.

Preferred dendrons are a substituted or unsubstituted dendron of formulae (XIb) and (XIc):

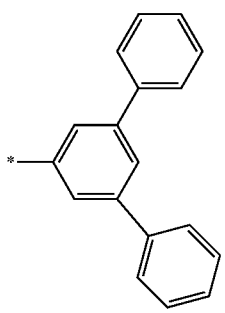

(XIb)

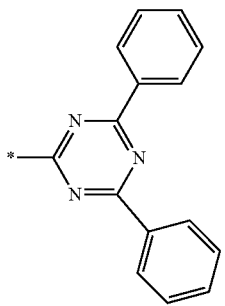

(XIc)

wherein * represents an attachment point of the dendron to a core.

BP and/or any group G may be substituted with one or more substituents, for example one or more $C_{1-20}$ alkyl or alkoxy groups.

The phosphorescent material may be covalently bound to a host material of or may be mixed with a host material.

The phosphorescent material may be covalently bound to a host polymer or a hole-transporting polymer as a repeat unit in the polymer backbone, as an end-group of the polymer, or as a side-chain of the polymer. If the phosphorescent material is provided as a side-chain then it may be directly bound to a repeat unit in the backbone of the polymer or it may be spaced apart from the polymer backbone by a spacer group. Exemplary spacer groups include $C_{1-20}$ alkyl and aryl-$C_{1-20}$ alkyl, for example phenyl-$C_{1-20}$ alkyl. One or more carbon atoms of an alkyl group of a spacer group may be replaced with O, S, C=O or COO.

A phosphorescent material mixed with a host material may form 0.1-50 weight %, optionally 0.1-30 wt % of the weight of the components of the layer containing the phosphorescent material If the phosphorescent material is covalently bound to a host then repeat units comprising the phosphorescent material, or an end unit comprising the phosphorescent material, may form 0.1-20 mol %, optionally 0.1-5 mol % of the polymer.

Hole Injection Layers

A hole injection layer may be provided between the anode 103 and the light-emitting layer 105. The hole-injection layer may be formed from a conductive organic or inorganic material, and may be formed from a degenerate semiconductor.

Examples of conductive organic materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx, MoOx and RuOx as disclosed in Journal of Physics D: Applied Physics (1996), 29(11), 2750-2753.

Cathode

The cathode 107 is selected from materials that have a work function allowing injection of electrons into the light-emitting layer 105 of the OLED. Other factors influence the selection of the cathode such as the possibility of adverse interactions between the cathode and the light-emitting material. The cathode may consist of a single material such as a layer of aluminium. Alternatively, it may comprise a plurality of conductive materials such as metals, for example a bilayer of a low work function material and a high work function material such as calcium and aluminium, for example as disclosed in WO 98/10621. The cathode may comprise elemental barium, for example as disclosed in WO 98/57381, Appl. Phys. Lett. 2002, 81(4), 634 and WO 02/84759. The cathode may comprise a thin, preferably 0.5-5 nm, layer of metal compound, in particular an oxide or fluoride of an alkali or alkali earth metal, between the organic layers of the device and one or more conductive cathode layers to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a work function of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A formulation suitable for forming a layer containing a polymer of formula (I) may be formed from a formulation comprising the polymer of formula (I) and any other components of the layer to be formed, and one or more suitable solvents.

The formulation may be a solution of the components of the layer in question, or may be a dispersion in the one or more solvents in which one or more components are not dissolved. Preferably, the formulation is a solution.

Exemplary solvents include benzenes substituted with one or more substituents selected from $C_{1-10}$ alkyl and $C_{1-10}$ alkoxy groups, for example toluene, xylenes and methylanisoles.

Particularly preferred solution deposition techniques including printing and coating techniques such spin-coating and inkjet printing.

Coating methods are particularly suitable for devices wherein patterning of the light-emitting layer is unnecessary—for example for lighting applications or simple monochrome segmented displays.

Printing methods are particularly suitable for high information content displays, in particular full colour displays. A device may be inkjet printed by providing a patterned layer over the anode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, slot die coating, roll printing and screen printing.

If a hole-transporting layer is formed between the anode and the light-emitting layer then the hole-transporting layer may be crosslinked by thermal treatment or by irradiation, for example UV irradiation, before the light-emitting layer is formed. Thermal crosslinking may be at a temperature in the range of about 80-250° C., optionally about 80-200° C. or about 150-200° C.

EXAMPLES

Monomer Example 1

2,6-dibromofluorene (Stage 1)

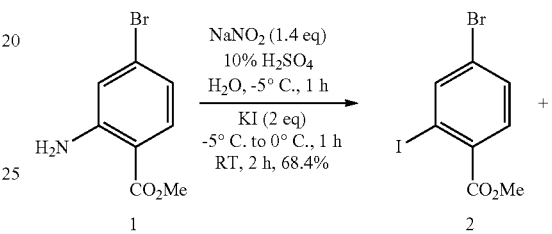

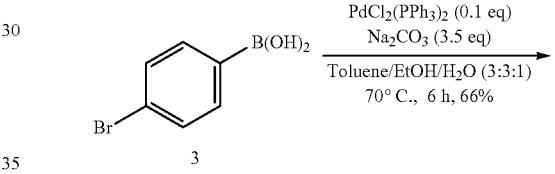

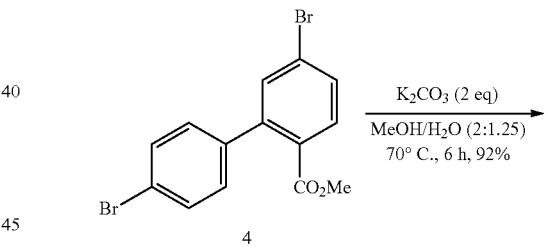

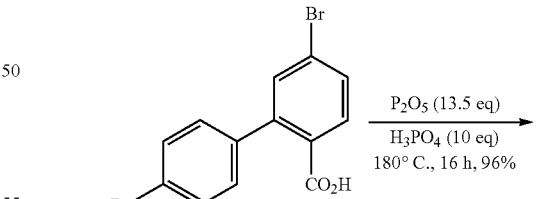

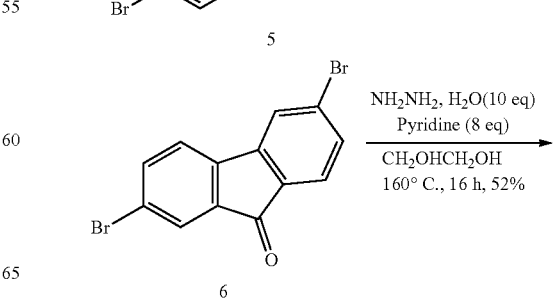

-continued

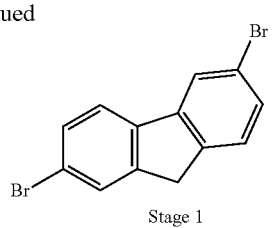
Stage 1

Methyl 2-amino-4-bromobenzoate (200 g, 0.8693 mol) was taken in water (2 L). 10% $H_2SO_4$ (2 L) was added to the mixture at RT. The mixture was cooled to −5° C. and then $NaNO_2$ (83.97 g, 1.2170 mol) dissolved in water (840 mL) was added slowly over a period of 1.5 h. The reaction was stirred at the same temperature for 1 h. KI (288.69 g, 1.7391 mol) was added slowly to the mixture at −5° C. The reaction was stirred at −5° C. to 0° C. for 1 h and then stirred at RT for 2 h. The mixture was extracted with EtOAc (750 mL×2) and the combined organic layer was washed with brine (1 L).

The organic layer was dried over sodium sulphate and concentrated to get viscous liquid. Another batch was done by following the same procedure with same quantity.

The combined crude (550 g) was purified by flash column chromatography to obtain methyl 2-iodo-4-bromobenzoate in 68.4% yield (i) Fraction 1: 225 g. (ii) Fraction 2: 126 g.

A mixture of methyl 2-iodo-4-bromobenzoate (200 g, 0.588 mol) and 4-bromophenylboronic acid (123.4 g, 0.617 mol) was taken in toluene (1200 mL):EtOH (1200 mL): water (400 mL) and $Na_2CO_3$ (218.2 g, 2.058 mol) was added to the mixture. The mixture was degassed with nitrogen for 45 min. Bis(triphenylphosphine)palladium(II)chloride (41.2 g, 0.0588 mol) was added to the mixture and again degassed with nitrogen for 20 min. The mixture was heated at 70° C. for 6 h. The mixture was cooled to RT and diluted with ethyl acetate (750 mL). The mixture was filtered through a celite bed.

The filtrate was washed with brine solution (500 mL) and dried over $Na_2SO_4$ and concentrated under reduced pressure to obtain the crude.

Another batch was done by following the same procedure with same quantity.

The combined crude (510 g) was purified by flash column chromatography followed by repeated crystallization with cold hexane to obtain 287 g of Methyl 4',5-dibromo-[1,1'-biphenyl]-2-carboxylate in 66% yield.

Methyl 4',5-dibromo-[1,1'-biphenyl]-2-carboxylate (287 g, 0.7757 mol) was taken in MeOH:water (11.4 L: 7.1 L). $K_2CO_3$ (241.4 g, 1.5514 mol) was added and heated at 70° C. for 6 h. After cooling to RT, the mixture was acidified using 1.5 N HCl (aq.) (pH=3). The solid thus obtained was filtered, washed with water and dried under vacuum to get 255 g of 4',5-Dibromo-[1,1'-biphenyl]-2-carboxylic acid with 92% yield.

To $P_2O_5$ (617 g, 4.348 mol) at RT, orthophosphoric acid (315 g, 3.221 mol) was added slowly under vigorous stirring. The mixture was heated at 120° C. for 3 h. The reaction mixture was cooled to 80° C. and 4',5-dibromo-[1,1'-biphenyl]-2-carboxylic acid (115 g, 0.322 mol) was added. The whole reaction mixture was heated at 180° C. for 16 h. The reaction is cooled and quenched with ice cold water (2 L). After cooling to RT, the reaction mixture was filtered. The solid was added to aq. $NaHCO_3$ (1 L) and stirred for 1 h. Another batch was done by following the same procedure with same quantity. The solid thus obtained was filtered and dried under vacuum to get 209 g of 2,6-Dibromo-9H-fluoren-9-one (Yield=96%).

A mixture of 2,6-Dibromo-9H-fluoren-9-one (190 g, 0.562 mol) and hydrazine monohydrate (281 g, 5.621 mol) was taken in diethyleneglycol (3800 mL). Pyridine (355 g, 4.497 mol) was added to the mixture. It was heated at 160° C. for 16 h. The reaction mixture was cooled to 50° C. and water (2 L) was added, followed by EtOAc (3 L). The aqueous layer was acidified and extracted with EtOAc (2×1 L). The organic layer was washed with water, dried over sodium sulphate and evaporated to get the crude 210 g with 87.32% HPLC purity. It was purified by flash column chromatography followed by repeated recrystallization using IPA to get 104 g of 2,6-dibromofluorene (Yield=52%). Monomer Example 1 was prepared according to the following reaction scheme:

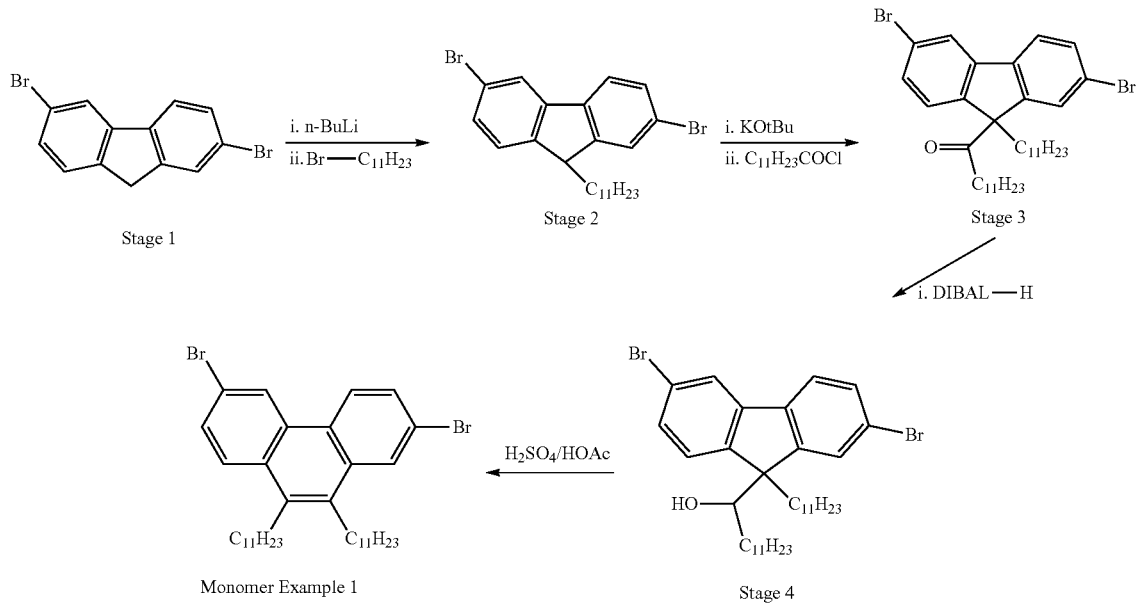

Synthesis of 2,6-dibromo-9-undecylfluorene (Stage 2)

Butyl lithium (2.5 M in hexanes, 127 ml, 318 mmoles) was added dropwise over 40 minutes to a degassed suspension of 2,6-dibromofluorene (103.0 g, 317.9 mmoles) in dry diethyl ether (1 L) under nitrogen maintaining the temperature below 30° C. by using an ice bath when necessary and the reaction mixture was then left to stir at room temperature for a further 2 hours. This solution was then added slowly to a degassed solution of 1-bromoundecane (89.7 g, 381.5 mmoles) in dry diethyl ether (1 L) under nitrogen maintaining the temperature below 30° C. by using an ice bath when necessary and the reaction mixture was then left to stir at room temperature for a further 2 hours. Citric acid (1M aqueous, 330 ml) was then added slowly with stirring. The organic layer was separated, washed with water (3×150 ml), dried over anhydrous magnesium sulfate and evaporated to give a red/brown oil (167.5 g). Purification by column chromatography (silica, hexane) gave the desired product (137.42 g, 90%) with a purity of >97% as measured by HPLC and GCMS.

Synthesis of 2,6-dibromo-9-undecyl-9-dodecanoylfluorene (Stage 3)

Potassium t-butoxide (38.44 g, 342.59 mmoles) was added in portions to a degassed solution of 2,6-dibromo-9-undecylfluorene (136.55 g, 285.49 mmoles) in dry diethyl ether (1.5 L) under nitrogen and then stirred at room temperature under nitrogen for a further 2.5 hours. This solution was then added slowly to a degassed solution of lauroyl chloride (100 ml, 430 moles (excess)) in dry diethyl ether (1.5 L) under nitrogen and stirred for a further 75 minutes at room temperature. Water (400 ml) was cautiously added and the organic layer was separated, washed with sodium hydrogencarbonate solution (sat. aqueous, 2×200 ml) and water (3×200 ml), dried over anhydrous magnesium sulfate and evaporated to give a yellow oil (230 g). Purification by column chromatography (silica, 5% ethyl acetate in hexane) gave the desired product (151.06 g) with a purity of 93.3% as measured by HPLC, which was used in the subsequent reaction without any further purification.

Synthesis of 2,6-dibromo-9-undecyl-9-(1'-hydroxydodecyl)fluorene (Stage 4)

A solution of diisobutylaluminium hydride (1M in dichloromethane, 340 ml, 340 moles) was added dropwise over 1 hour to a solution of 2,6-dibromo-9-undecyl-9-dodecanoylfluorene (149.6 g, 226.5 mmoles) in dry dichloromethane (1.8 L) under nitrogen, such that the temperature did not rise above 25° C. and the reaction mixture was then stirred at room temperature for a further 4 hours. The reaction mixture was then cooled to 10° C. in an ice bath and citric acid (1M aqueous, 300 ml) was slowly added with stirring and then dilute hydrochloric acid (1M aqueous, 500 ml) was then added to break up the aluminium complex. The aqueous layer was separated and extracted with dichloromethane (3×100 cm3) and the combined organic fractions were washed with water (3×200 ml), dried over anhydrous magnesium sulfate and evaporated to give a yellow oil. Purification by column chromatography (silica, dichloromethane:hexane (1:3)) gave the desired product as a clear colourless oil (111.4 g) with HPLC showing two close-running compounds that gave a combined purity of 99.7%.

Synthesis of 2,6-dibromo-9,10-diundecylphenanthrene (Monomer Example 1)

Sulfuric acid (conc, 6.5 ml) was added slowly to a refluxing solution of 2,6-dibromo-9-undecyl-9-(1'-hydroxydodecyl)fluorene (64.2 g, 96.9 mmoles) in acetic acid (640 ml) which was then refluxed for a further 1 hour and allowed to cool. Water (1 L) was then added with stirring and the mixture was then extracted with diethyl ether (4×200 ml). The combined organic fractions were washed with water (4×200 ml), potassium carbonate (aqueous, 2M, 200 ml) and water (2×150 ml), dried over anhydrous magnesium sulfate and evaporated to give a pale brown oil (62.3 g). Purification was by a combination of column chromatography (silica: caffeine (9:1), hexane) and then recrystallisations from propan-2-ol to give the desired product as a white crystalline solid (49.9 g) with a purity of 99.65% by HPLC.

Polymer Example 1

Polymer Example 1 was formed by Suzuki polymerisation as described in WO 00/53656 using 50 mol % of Monomer Example 1 and 50 mol % of a diboronic ester monomer for forming a fluorene repeat unit of formula (VIIa).

Comparative Polymer 1

A polymer was prepared as described for Polymer Example 1 except that the diboronic ester used was for forming a 2,5-dialkylphenylene repeat unit of formula (VIa). The 2,5-dialkylphenylene repeat units are twisted out of the plane of adjacent repeat units, limiting the conjugation of this polymer.

Comparative Polymer 2

A homopolymer of fluorene repeat units of formula (VIIa) was prepared by Suzuki polymerisation as described in WO 00/53656.

Figure 2:
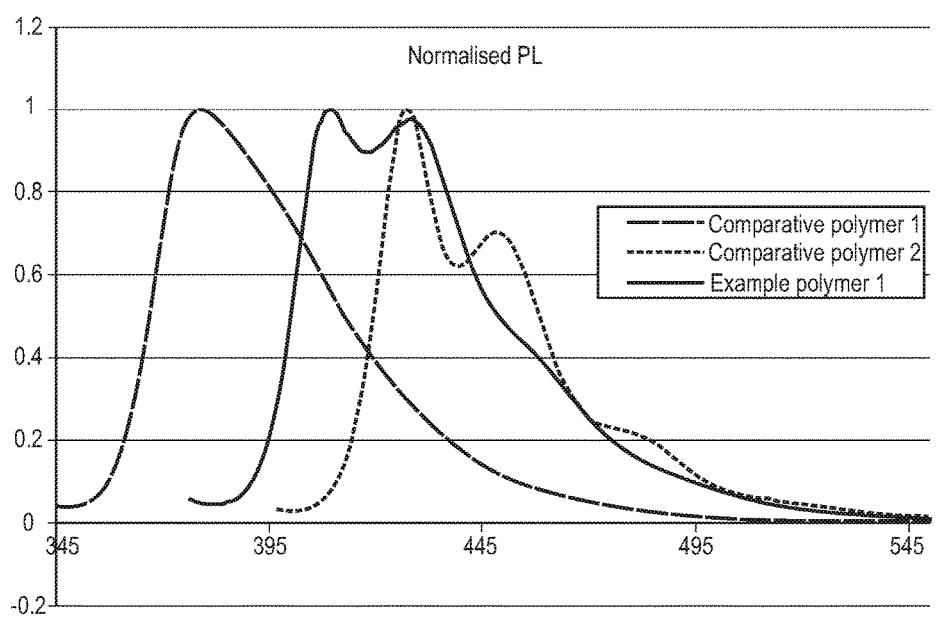
FIG. 2 shows the photoluminescence spectra of a polymer according to an embodiment of the invention and two comparative polymers.

Photoluminescence spectra of Polymer Example 1 and Comparative Polymers 1 and 2 are shown in FIG. 2. Polymer Example 1 has a shorter peak wavelength than Comparative Polymer 2 which is attributed to a lower degree of conjugation of Polymer Example 1 as compared to Comparative Polymer 2.

Polymer Example 2

A polymer was prepared by Suzuki polymerisation as described in WO 00/53656 of a diboronic ester monomer for forming a fluorene repeat unit of formula (VIIa) (50 mol %), Monomer Example 1 (25 mol %), and dibromo monomers for forming a fluorene repeat unit of formula (VIIa) (18 mol %), a repeat unit of (III-1) (4 mol %) and a repeat unit of formula (III-3) (3 mol %).

Comparative Polymer 3

A polymer was prepared as described for Polymer Example 2 except that Monomer Example 1 was replaced with Comparative Monomer 1:

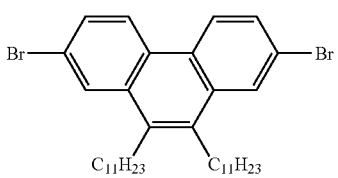

Comparative Monomer 1

Figure 3:
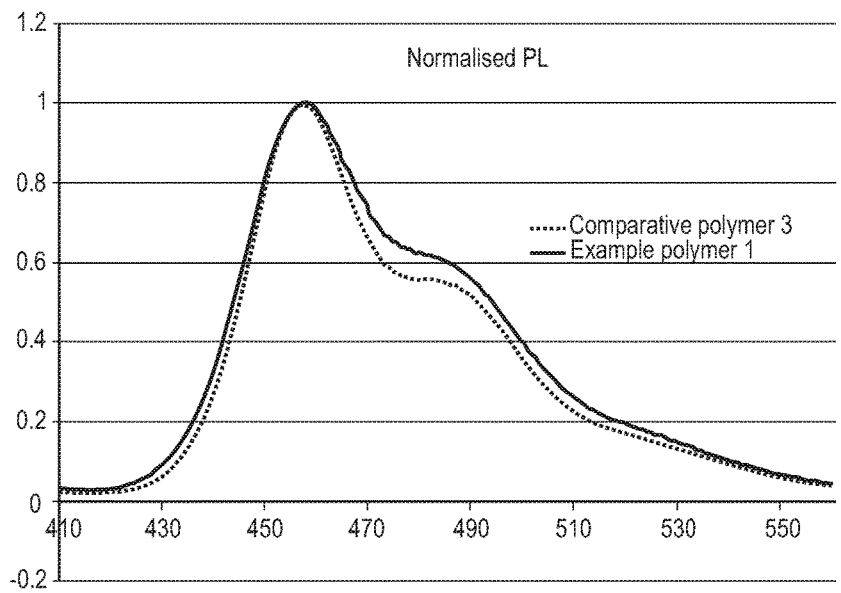
FIG. 3 shows the photoluminescence spectra of a polymer according to an embodiment of the invention and a comparative polymer.

Photoluminescence spectra of Polymer Example 2 and Comparative Polymer 3 are shown in FIG. 3. The peak is at a similar wavelength for both polymers however the spectrum for Polymer Example 2 is broader which may give a higher colour rendering index when this polymer is used as the blue component of a white light-emitting device, particularly for white devices producing "cool" white emission (CCT>3500K).

Device Example 1

An organic light-emitting device having the following structure was formed on a glass substrate:
ITO/HIL/HTL/EL/Cathode
wherein ITO is an indium-tin oxide anode; HIL is a layer of hole-injection material; HTL is a hole transporting layer; EL is a light-emitting layer formed by spin-coating Polymer Example 2; and Cathode is a cathode of a trilayer of sodium fluoride, aluminium and silver.

HIL, HTL and EL were each formed by spin-coating a solution comprising the components of that layer and a solvent, and evaporating the solvent.

HTL was formed by spin-coating and crosslinking a hole-transporting polymer formed by Suzuki polymerisation, as described in WO 00/53656, and containing a dialkylphenylene repeat unit of formula (VIa); an amine repeat unit as described in WO 2005/049546; and fluorene repeat units of formula (VIIa) substituted with crosslinkable groups.

Comparative Device 1

A device was prepared as described for Device Example 1 except that Comparative Polymer 3 was used in place of Polymer Example 2.

Figure 4:
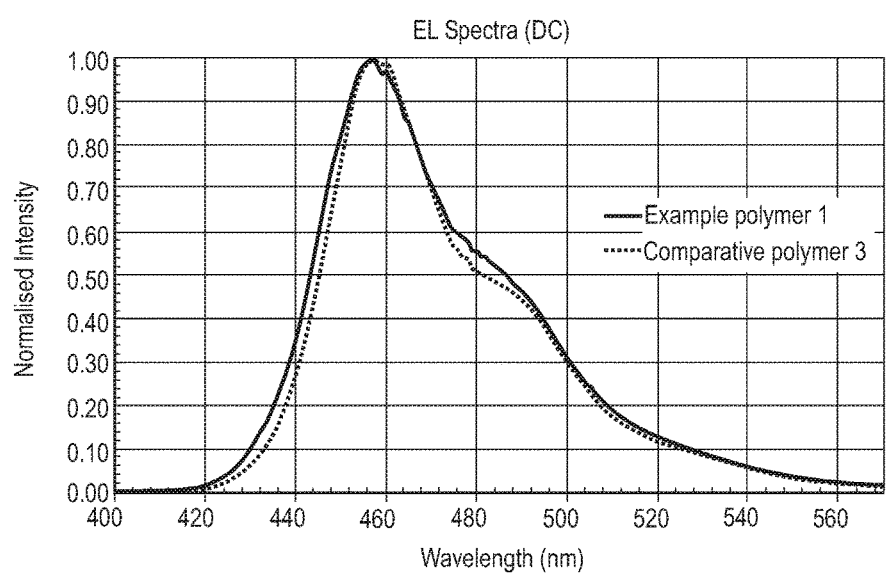
FIG. 4 shows the electroluminescence spectra of OLEDs containing light-emitting layers formed from the polymers of FIG. 3.

With reference to FIG. 4, the electroluminescence peak is at a similar wavelength for both Device Example 1 and Comparative Device 1 however the spectrum for Device Example 1 is broader.

Comparative Polymer 4

Synthesis of a polymer was attempted as described for Polymer Example 1 except that Monomer Example 1 was replaced with Comparative Monomer 1, illustrated above.

The attempted polymerisation was unsuccessful, which was attributed to a relatively poor solubility of the rod-like polymer structure of Comparative Polymer 3 as compared to the non-linear backbone of Polymer Example 1.

Figure 5:
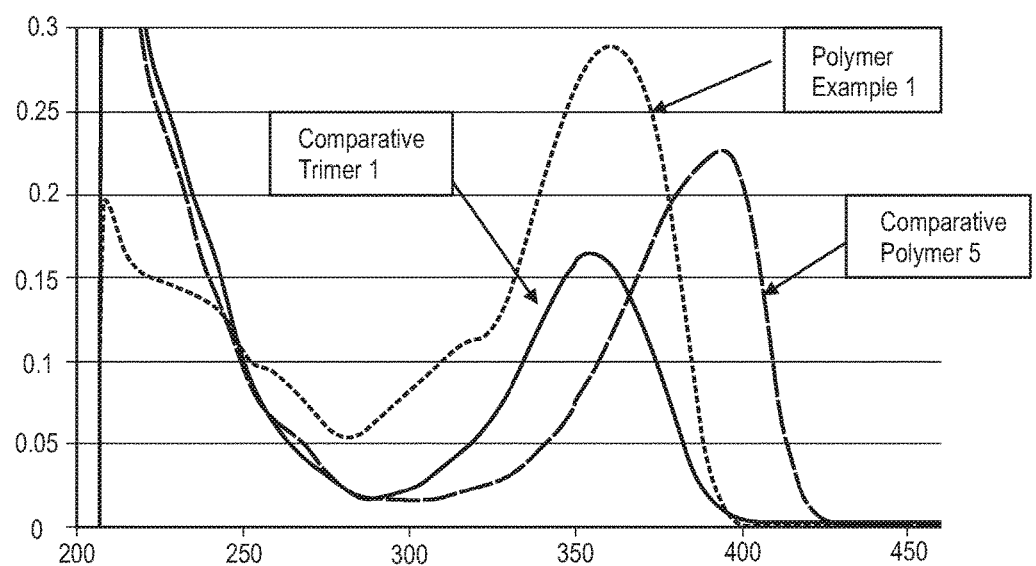
FIG. 5 shows the absorption spectra of a polymer according to an embodiment of the invention, a comparative polymer and a fluorene trimer model compound.

FIG. 5 is an absorption spectrum for Polymer Example 1 compared to a fluorene homopolymer (Comparative Polymer 5) and a fluorene trimer model compound (Comparative Trimer 1). Polymer Example 1 has an absorption peak at a shorter wavelength than Comparative Polymer 5, which is attributed to the lower degree of conjugation of Polymer Example 1 as compared to Comparative Polymer 5.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A polymer comprising a repeat unit of formula (I):

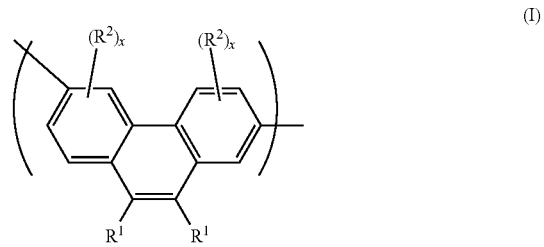

(I)

wherein $R^1$ in each occurrence is independently H or a substituent; $R^2$ in each occurrence is independently a substituent; and x is 0, 1, 2 or 3;
wherein the repeat unit of formula (I) is bound directly to aromatic carbon atoms of adjacent repeat units by carbon-carbon bonds between aromatic carbon atoms of the repeat unit of formula (I) and the aromatic carbon atoms of the adjacent repeat units.

2. A polymer according to claim 1 wherein each $R^1$ is independently a $C_{1-40}$ hydrocarbyl group.

3. A polymer according to claim 1 wherein each x is 0.

4. A polymer according to claim 1 wherein at least one x is at least 1.

5. A polymer according to claim 1 wherein each $R^2$ is independently a $C_{1-40}$ hydrocarbyl group.

6. A polymer according to claim 1 wherein the polymer is a copolymer comprising one or more co-repeat units.

7. A formulation comprising a polymer according to claim 1 and at least one solvent.

8. An organic light-emitting device comprising an anode, a cathode and a semiconducting region between the anode and the cathode wherein the semiconducting region comprises a polymer comprising a repeat unit of formula (I):

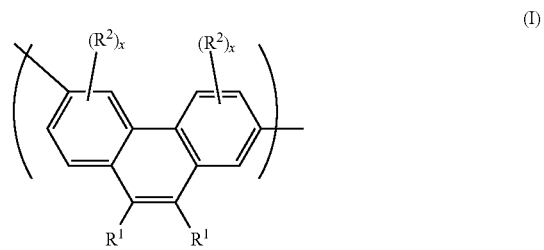

(I)

wherein $R^1$ in each occurrence is independently H or a substituent; $R^2$ in each occurrence is independently a substituent; and x is 0, 1, 2 or 3;
wherein the repeat unit of formula (I) is bound directly to aromatic carbon atoms of adjacent repeat units by carbon-carbon bonds between aromatic carbon atoms of the repeat unit of formula (I) and the aromatic carbon atoms of the adjacent repeat units.

9. An organic light-emitting device according to claim 8 wherein the semiconducting region comprises a light-emitting layer comprising the polymer.

10. An organic light-emitting device according to claim 8 wherein the semiconducting region comprises a light-emitting layer and a charge-transporting layer, the charge-transporting layer comprising the polymer.

11. An organic light-emitting device according to claim 8 wherein the device emits white light.

12. A method of forming a device according to claim 8, the method comprising the steps of depositing a formulation comprising a polymer comprising a repeat unit of formula (I):

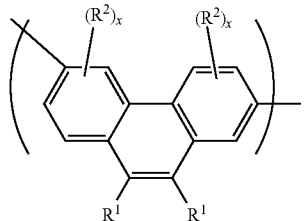

wherein $R^1$ in each occurrence is independently H or a substituent; $R^2$ in each occurrence is independently a substituent; x is 0, 1, 2 or 3; and at least one solvent and evaporating the at least one solvent.

13. A method for a use of a repeat unit of formula (I) to enhance the solubility of a polymer:

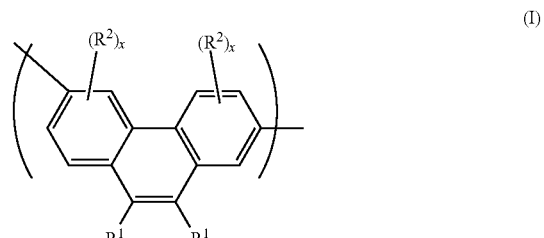

wherein $R^1$ in each occurrence is independently H or a substituent; $R^2$ in each occurrence is independently a substituent; and x is 0, 1, 2 or 3;

wherein the repeat unit of formula (I) is bound directly to aromatic carbon atoms of adjacent repeat units by carbon-carbon bonds between aromatic carbon atoms of the repeat unit of formula (I) and the aromatic carbon atoms of the adjacent repeat units.

* * * * *